United States Patent [19]

Gulczynski

[11] Patent Number: 4,866,398

[45] Date of Patent: Sep. 12, 1989

[54] ANALOG POWER AMPLIFIER

[76] Inventor: Zdzislaw Gulczynski, P.O. Box 441, Winchester, Mass. 01890

[21] Appl. No.: 180,432

[22] Filed: Apr. 12, 1988

[51] Int. Cl.$^4$ .............................................. H03F 3/26
[52] U.S. Cl. .................................... 330/263; 330/255; 330/264
[58] Field of Search ............... 330/118, 255, 263, 264, 330/267, 268, 310, 311

[56] References Cited

U.S. PATENT DOCUMENTS 4,176,323  11/1979  Odell .................................. 330/263
4,433,303   2/1984  Sasaki ................................. 330/264

Primary Examiner—Steven Mottola

[57] ABSTRACT

The power amplifier incorporates push-pull stages, output transistors providing controllable output currents and a bias circuit completely eliminating switching of the output transistors. No thermal compensation and no matching thereof, and no adjustments are necessary.

An input amplifier amplifies in input signal and has a pair of outputs. A pair of resistors is separately coupled in series with power supply outputs. A pair of output amplifiers each has a first and second inputs for amplifying a signal appearing thereacross, and an output, wherein the first inputs are separately coupled to the input amplifier outputs and the second inputs are separately coupled to the resistors. A pair of transistors each has a base, first and second electrodes, wherein the bases are separately coupled to the output amplifier outputs, the first electrodes are separately coupled to the resistors, and the second electrodes are coupled together for providing an output signal of the power amplifier.

14 Claims, 6 Drawing Sheets

ANALOG POWER AMPLIFIER

CROSS REFERENCE TO RELATED INVENTIONS

This application is related to "Ultra Fast Logic" Ser No. 180,431 filed herewith "High Efficiency Power Amplifier Comprising Multilevel Power Supply" Ser. No. 180,433 filed herewith; "High Speed Instrumentation Amplifier with Minimized Offset Voltage and Drift" Ser. No. 180,434 filed herewith; "Switching Power Amplifier" U.S. Pat. No. 4,763,080 dated Aug. 9, 1988; "Operational Amplifier" U.S. Pat. No. 4,749,958 dated June 7, 1988; "Power Amplifier" U.S. Pat. No. 4,782,306 dated Nov. 1, 1988; "Operational Amplifier or Comparator Circuit with Minimized Offset Voltage and Drift" U.S. Pat. No. 4,749,953 dated June 7, 1988; "Operational Amplifier" U.S. Pat. No. 4,714,894 dated Dec. 22, 1987; "Operational Amplifier" U.S. Pat. No. 4,634,996 dated Jan. 6, 1987; and "Push-Pull Power Amplifier" U.S. Pat. No. 4,476,441 dated Oct. 9, 1984. All inventions are by the same inventor.

BACKGROUND OF THE INVENTION

The invention relates to an analog power amplifier (PA), particularly for a closed loop signal amplification requiring high output power, high speed and wide operating temperature range.

Power amplifiers are devices designed to amplify an input signal and provide an undistorted high power output signal, i.e. an alternate current within a wide range of an output voltage; independent of supply voltages, load fluctuations over frequency, operating temperature, etc. The parameters such as input impedance, input offset voltage or open loop gain are not essential.

Conventional PAs comprise single-ended stages which results in a low and asymmetrical slew rate and a slow recovery from clipping. Multiple stages cause cumulative phase shift which impairs the stability. Crossover distortions are minimized by excessive quiescent current causing an extensive power dissipation even with no load. The switching of the power transistors is not completely eliminated however, as each transistor is cut off at a higher output current of the complementary transistor, even worse, a reverse base-emitter voltage is applied thereto.

A thermal compensation, simple in principle, is very inaccurate, unreliable and difficult to accomplish; it demands temperature compensation of at least two complementary high power transistors by means of floating low power components thermally coupled thereto. The quiescent current must be adjusted manually, whereby its stability is very poor. A matching of power transistor is laborious and troublesome, and in case of MOSFETs very difficult to achieve. Furthermore, the temperature coefficient of the MOSFET's gate-source voltage varies in a very wide range and has a zero value at a drain current mostly much higher than a desired quiescent current. Collectors or drains of the transistors, coupled to the cases thereof during a manufacturing process, are on different potentials. Insulating wafers introduce large parasitic capacitances and increase thermal impedance keeping individual devices at more uneven temperature.

The output voltage swing is reduced by the base-emitter or gate-source voltages of the power transistors which can be significant for high output currents and is generally very high for power MOSFETs. In order to improve the stability and accuracy of the quiescent current and minimize the likehood of thermal runaway of the power transistors, power resistors coupled is series with the load are used.

The efficiency is improved by providing a multiple level power supply. The supply voltage of the PA is switched to different values according to the output signal level, usually by means of power switches. The transition must occur at a relatively high voltage across a corresponding power transistor of the amplifier in order to prevent its saturation. The instant voltage switching at a high output current puts an enormous stress on the power transistors designed for a signal amplification, and degrades their long-term reliability. Moreover, the distortion level of the PA is significantly higher due to the switching.

SUMMARY OF THE INVENTION

The invention is intended to solve the above problems and therefore the object of the invention is to provide a PA having high output power, high speed, wide operating temperature range and a low number of components. According to the invention a PA with push-pull stages, output transistors providing controllable output currents and a bias circuit completely eliminating switching of the output transistors solves these problems. A very high efficiency can be obtained by a PA comprising a multilevel power supply, further completely eliminating controllable power switches. No thermal compensation and no matching of the output transistors, and no adjustments are necessary.

A PA according to the present invention comprises an input amplifier means for amplifying an input signal of the PA and having a pair of outputs, a power supply means having a pair of outputs for providing supply signals, a pair of resistive means separately coupled in series with the power supply outputs, a pair of output amplifier means each having a first and second inputs for amplifying a signal appearing thereacross, and an output, wherein the first inputs are separately coupled to the input amplifier means outputs and the second inputs are separately coupled to the resistive means, and a pair of transistors each having a base, first and second electrodes, wherein the bases are separately coupled to the output amplifier means outputs, the first electrodes are separately coupled to the resistive means, and the second electrodes are coupled together for providing an output signal of the PA.

In one embodiment, the first and second electrodes of at least one transistor are a collector and emitter respectively, and the first and second inputs of the output amplifier means coupled to the one transistor are inverting and noninverting respectively. In another embodiment the first and second electrodes of at least one transistor are an emitter and collector respectively, and the first and second inputs of the output amplifier means coupled to the one transistor are noninverting and inverting respectively.

BRIEF DESCRIPTION OF THE DRAWINGS

The present invention will become more clear in conjunction with the accompanying Figures of which.

Throughout the drawings, similar references denote similar parts.

DETAILED DESCRIPTION OF THE INVENTION

Figure 1:
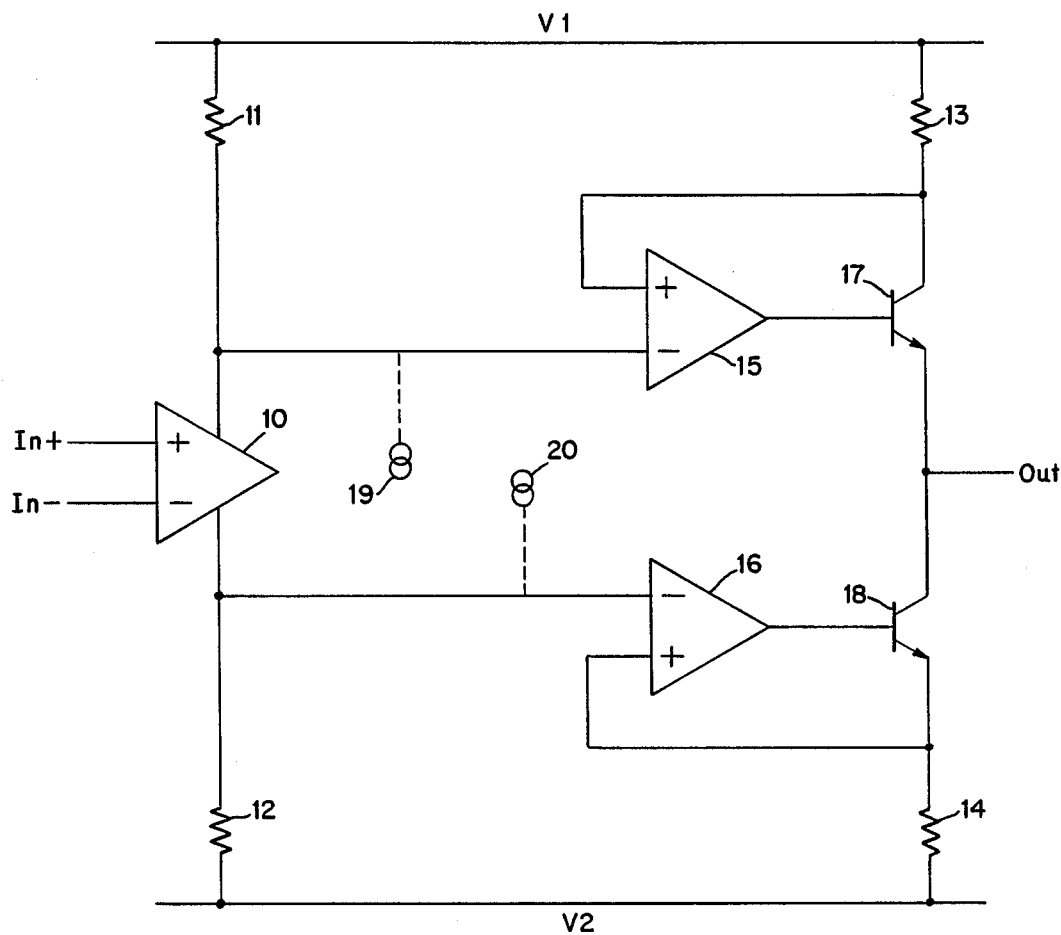
FIG. 1 is an embodiment of the PA with output transistors having emitters coupled together.

FIG. 1 is an embodiment of the PA with output transistors having emitters coupled together. The input signal is applied to the differential inputs In+ and In− of the input amplifier means. The means consists of the amplifier 10 providing these inputs and having a pair of outputs, a pair of optional current sources, and a pair of resistors. Specifically, one of the amplifier 10 outputs, the resistor 11 and current source 19 are coupled to one of the input amplifier means outputs. The other output of the amplifier 10, the resistor 12 and current source 20 are coupled to the other input amplifier means output. The voltage sources V1 and V2 are coupled to other ends of the resistors 11 and 12 respectively. The sources V1 and V2 represent a power supply, wherein one of the sources may be ground.

The outputs of the input amplifier means are separately coupled to inputs of a pair of output amplifier means each having a pair of differential inputs and an output, and each consisting of an operational amplifier (OA). Specifically, the resistors 11 and 12 are coupled to the inverting inputs of the OAs 15 and 16 respectively. The outputs thereof are separately coupled to the bases of the transistors 17 (npn) and 18 (pnp) respectively. The collectors thereof and noninverting inputs of the OAs 15 and 16 are coupled via the resistors 13 and 14 to the sources V1 and V2 respectively. By these means negative feedbacks of the OAs 15 and 16 are established. As a result, the voltages appearing across the resistors 13 and 14 are substantially equal to voltage drops across the resistors 11 and 12 respectively.

The voltages appearing at the outputs of the amplifier 10, i.e. input amplifier means outputs, are changing in the same direction or at least one of the voltages remains substantially unchanged. This is in response to the input signal of the PA. For instance, the voltage across the resistor 11 may increase with an increasing input signal of the PA while the voltage across the resistor 12 may decrease, have a value determined by the optional current source 20 or be zero.

The collector current of the output transistors 17 and 18 flowing at the PA output current, and possibly PA output voltage, equal zero is called quiescent current. The quiescent current may be also a collector current of one of the transistors while the other transistor provides the output current of the PA. The quiescent current significantly increases performance of the entire PA by enhancing a linear operation of the transistors 17 and 18. The collector currents thereof are conducted by the resistors 13 and 14 respectively. Therefore, the quiescent current can be established by predetermining a minimum voltage drop across the resistors 11 and 12 respectively. The output currents of the amplifier 10 may be zero, e.g. for PA output signal equal zero. The current sources 19 and 20 assure a minimum voltage drop across the resistors 11 and 12 respectively. Thereby, the collector currents of the transistors 17 and 18 may be always greater than zero, independent of the output voltage and current of the PA.

The emitters of the transistors 17 and 18 are coupled together for providing an output signal of the PA, whereby a very low impedance output thereof is established. However, the transistors 17 and 18 also provide a current controlled by the voltages across the resistor 11 and 12 respectively. The output stage of the PA is therefore a voltage and current source combination and may be very useful for driving loads having a large reactive portion, e.g. acoustic loudspeakers. The output voltage swing of the PA can be increased by providing a separate power supply for the OAs 15 and 16.

Figure 2:
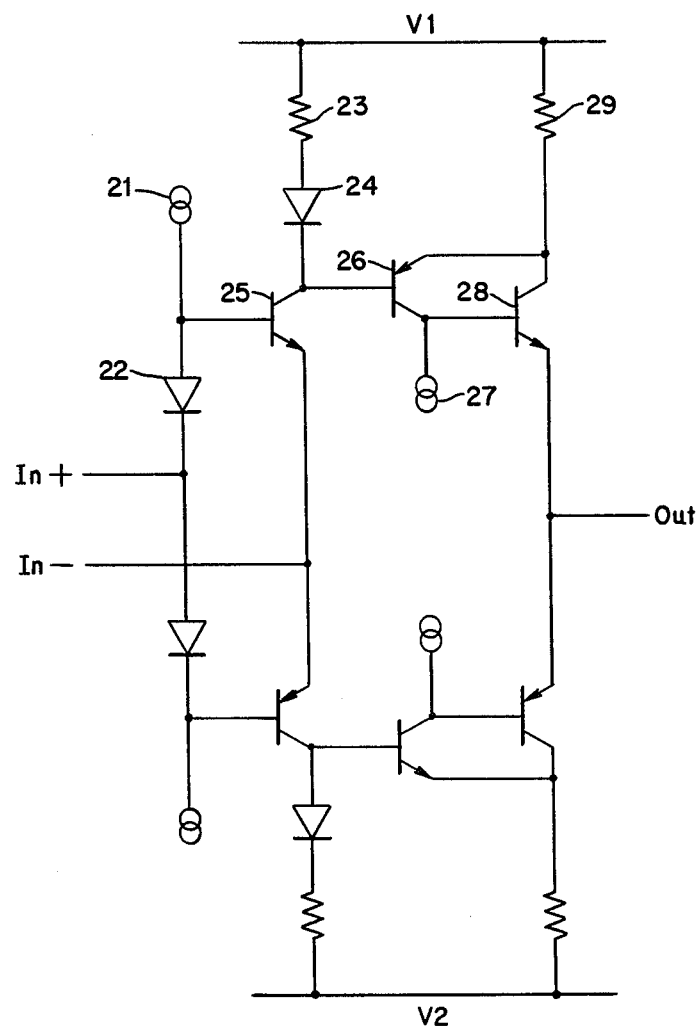
FIG. 2 is another PA based on the FIG. 1 embodiment.

FIG. 2 is another PA based on the FIG. 1 embodiment. For simplicity, only a half of the circuit is described hereinbelow due to its symmetrical operation and configuration, as clearly shown. The input signal of the PA is applied to differential inputs In+ and In− of the input amplifier means. Specifically, In+ is coupled via the conducting diode 22 to the current source 21 and base of the npn transistor 25. The emitter thereof is coupled to In−. The diode 22 compensates for the base-emitter voltage of the transistor 25. The source 21 provides a bias current. However, an input bias current of In+ is very small due to the employment of a like current source in the other half of the PA. An input bias current of In− depends on the output current of the PA.

The resistor 23 and conducting diode 24 are coupled in series between the source V1 and the collector of the transistor 25, further coupled to an output of the input amplifier means. One of the two output amplifier means consists merely of the pnp transistor 26 and current source 27 coupled to the collector thereof. Therefore, the base, emitter and collector of the transistor 26 are coupled to respectively inverting input, noninverting input and output of the output amplifier means. The voltage gain thereof is very high and is further increased by the gain of the npn transistor 28 as the negative feedback derives from the collector thereof. However, the transistor 28 operates in the common collector mode. The resistor 29 and transistor 28 correspond to respectively 13 and 17 of FIG. 1.

The collector current of the transistor 25 determines the quiescent current of the transistor 28. The voltage drops across the resistors 23 and 29 are substantially equal as the conducting diode 24 compensates for the base-emitter voltage of the transistor 26. The collector current of the transistor 25 depends on the PA differential input signal applied to In+ and In−. It further depends on the current of the source 21 which therefore incorporates the function of the source 19 of FIG. 1. However, the transistor 25 can be cut off. The collector current thereof is zero when a negative input voltage is applied between In+ and In−.

A thermal compensation can be easy accomplished as it applies to low power devices only, such as the diode 22 and transistor 25, the diode 24 and transistor 26. No thermal compensation and no matching of the output transistors is necessary. Any nonlinearities can be virtually eliminated by employing the PA as an output stage of an OA and establishing a negative feedback thereof. The second half of the PA comprises analogous components. In particular, the conductivity types of the respective transistors are opposite.

Figure 3:
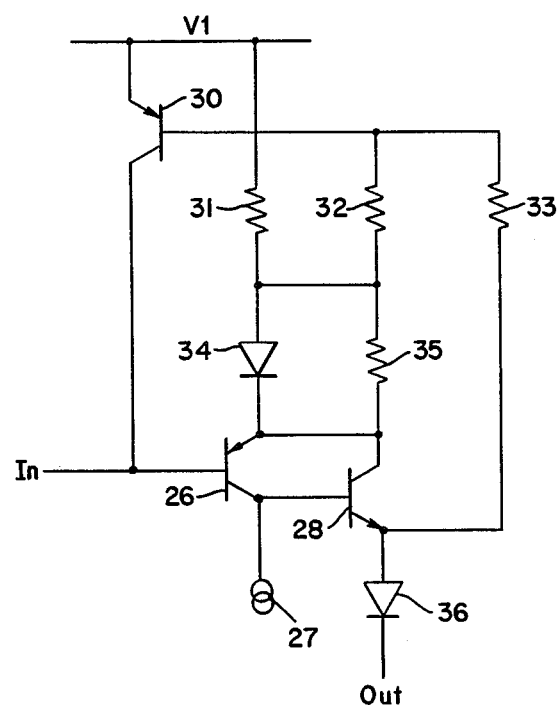
FIG. 3 is a part of the FIG. 2 embodiment, further including a short circuit protection and implementing an operation with a multilevel power supply.

FIG. 3 is a part of the FIG. 2 embodiment, further including a short circuit protection and implementing an operation with a multilevel power supply. Specifically, the components 26 thru 28 are common to FIGS. 2 and 3, wherein the same reference numbers have been assigned for clarity. Therefore, In is the input of the respective output amplifier means.

The stability of the quiescent current due to temperature changes, PA output signal etc., is improved. The resistor 35 corresponds to 29 of FIG. 2 and can have a higher value as the optional diode 34 is coupled in parallel for limiting a voltage drop thereacross. The quiescent current flowing thru the resistor 35 may result in a substantially higher voltage drop thereacross, wherein the diode 34 is then cut off.

The short circuit protection is accomplished by sensing an excessive collector current of the transistor 28 and accordingly limiting the input signal of the output amplifier means. An ordinary short circuit protection would limit the base-emitter voltage of the transistor 28. A resistor coupled anywhere in the collector-emitter path of the transistor 28 can be used. The resistor 31 of a small value, coupled to the collector of the transistor 28 via the resistor 35 is shown. A too high PA output current produced by the transistor 28 results in a collector current of the pnp transistor 30, further limiting the base signal of the transistor 26. The emitter and collector of the transistor 30 are coupled to the source V1 and base of the transistor 26 respectively.

The base of the transistor 30 is coupled to the resistor 31 via a resistor network for sensing a voltage at the emitter of the transistor 28 and accordingly determining the excessive current. Specifically, the resistors 32 and 33 are coupled to the base of the transistor 30 and weight respectively the voltage across the resistor 31 and the PA output voltage increased by the voltage of V1, with reference to V1. Thereby, the base-emitter voltage of the transistor 30 depends on the collector current of the transistor 28 and the PA output voltage. The short circuit current will decrease with increasing collector-emitter voltage of the transistor 28 so that an operation within the safe operating area (SOA) thereof can be determined. Nonlinear components, such as zener diodes, can be employed for sensing the PA output voltage and more accurately determining the excessive current within the SOA.

The connection of the resistor 31 to the supply voltage source V1 is preferred. A more accurate short circuit current can be easy obtained by means of an OA sensing the excessive collector current of the transistor 28. Specifically, a noninverting input of the OA can receive a fixed voltage with reference to V1, and its inverting input and open collector output can be coupled like respectively the base and collector of the transistor 30. A simplest short circuit protection can be obtained by eliminating the components 32 thru 35, whereby the excessive collector current is sensed across the resistor 31.

An operation with a multilevel power supply is made possible by the diode 36 which is connected in series with the emitter of the transistor 28 for preventing reverse polarity currents therein and in other components. Obviously, this reverse current protection and the hereinabove described short circuit protection can be analogously applied to the other half of the FIG. 2 PA. A high efficiency PA comprising a multilevel power supply is disclosed in the aforementioned "Power Amplifier" U.S. Pat. No. 4,782,306 dated Nov. 1, 1988 and "High Efficiency Power Amplifier Comprising Multilevel Power Supply" Ser. No. 180, 433 filed herewith, by the same inventor.

Figure 4:
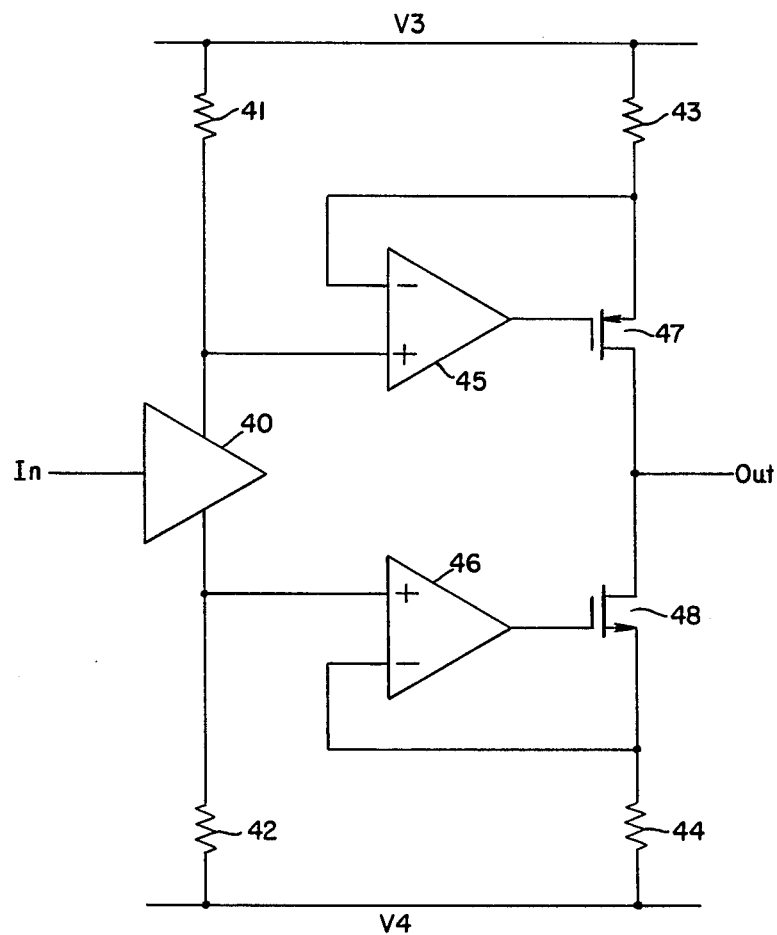
FIG. 4 is the preferred embodiment of the PA with output transistors having drains coupled together.

FIG. 4 is the preferred embodiment of the PA with output transistors having drains coupled together. The PA is very similar to that of FIG. 1, whereby all basic blocks can be distinguished. The components 40 thru 48 correspond to respectively 10 thru 18 of FIG. 1. Specifically, the input amplifier means consists of the components 40 thru 42, whereas the amplifier 40 provides the single input In. The output amplifier means consist of the OAs 45 and 46, wherein the noninverting inputs thereof are coupled to the resistors 41 and 42 respectively. The outputs of the OAs 45 and 46 are separately coupled to the gates of the MOSFETs 47 (p-channel) and 48 (n-channel) respectively. The sources thereof and inverting inputs of the OAs 45 and 46 are coupled via the resistors 43 and 44 to the sources V3 and V4 respectively. By these means negative feedbacks of the OAs 45 and 46 are established.

The drains of the transistors 47 and 48 are coupled together for providing an output signal of the PA, whereby a high open loop output impedance thereof is established. This may be very useful for driving loads having a large reactive portion, e.g. acoustic loudspeakers. The output voltage swing is inherently very high as the gate-source voltages of the MOSFETs 47 and 48 are not essential due to the common source configuration thereof. Furthermore, the transistors 47 and 48 can be assembled on a common heat sink without insulating wafers.

Figure 5:
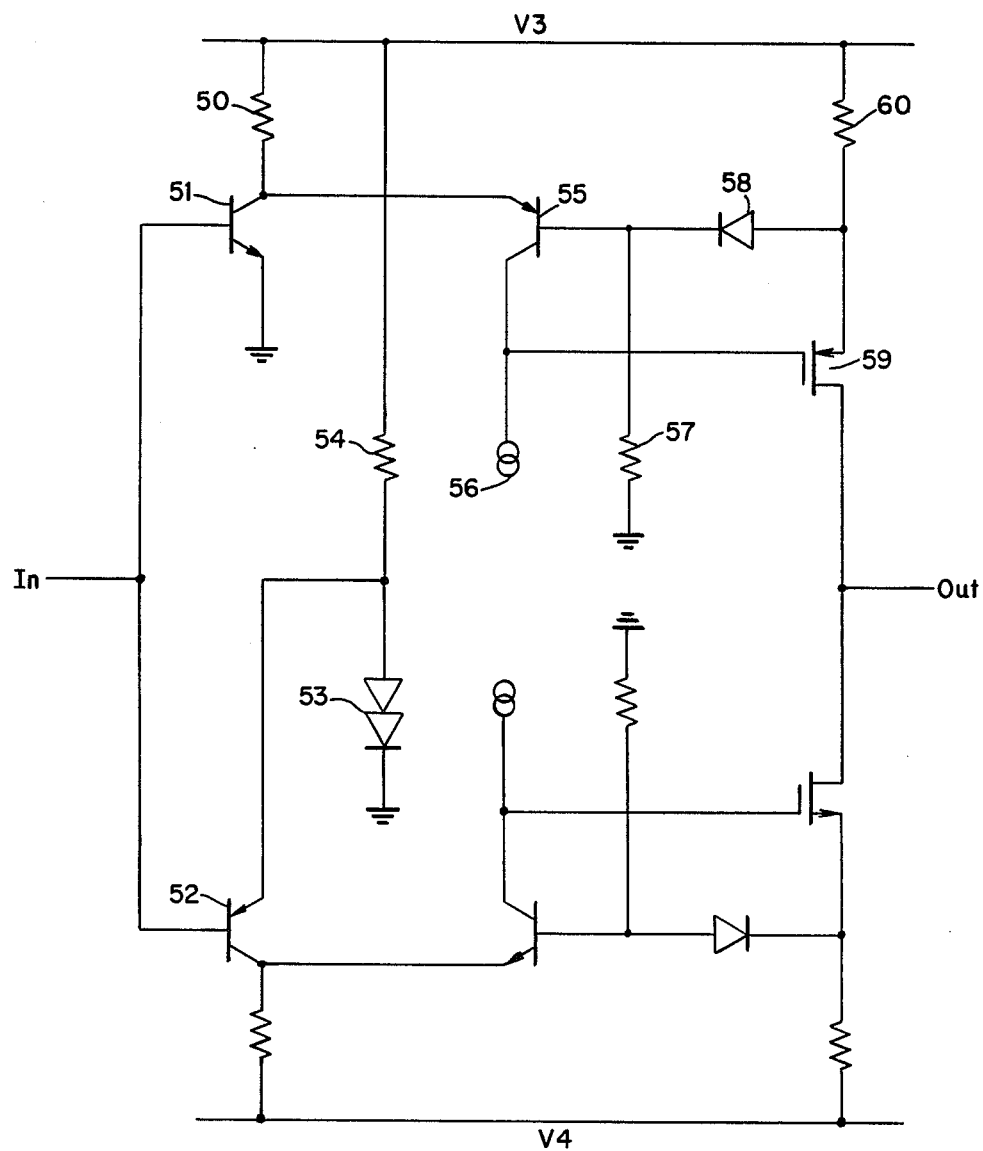
FIG. 5 is another PA based on the FIG. 4 embodiment.

FIG. 5 is another PA based on the FIG. 4 embodiment. For simplicity, only a half of the circuit is described hereinbelow due to its symmetrical operation and configuration, as clearly shown. The input signal of the PA is applied to the input In of the input amplifier means. Specifically, In is coupled to bases of the transistors 51 (npn) and 52 (pnp). The emitters thereof are coupled to ground and a reference source respectively. This source includes the conducting diode pair 53 coupled to the source V3 via the resistor 54 and to ground. The voltage across the diodes 53 compensates for base-emitter voltages of the transistors 51 and 52 and sets the bias thereof.

Specifically, the collector of the transistor 51 is coupled to the source V3 via the resistor 50 and also to an output of the input amplifier means. One of the two output amplifier means consists of the components 55 thru 58. The emitter, base and collector of the pnp transistor 55 are coupled to respectively a noninverting input, inverting input and output of the output amplifier means. Coupled to the resistor 60 is the anode of the conducting diode 58. The cathode thereof is coupled to the base of the transistor 55 and resistor 57. The voltage thereacross is approximately equal to the voltage of V3, whereby the current flowing thru the diode 58 is approximately equal to the current of current source 56. The resistor 60 and p-channel MOSFET 59 correspond to respectively 43 and 47 of FIG. 4.

The voltages across the resistors 50 and 60 are substantially equal as the diode 58 compensates for the base-emitter voltage of the transistor 55. The current flowing thru the resistor 50 consists mainly of the collector current of the transistor 51 and current of the source 56. Therefore, the voltage drop across the resistor 50 is always greater than zero and so is the drain current of the transistor 59, independent of the output voltage and current of the PA.

The common base configuration of the transistor 55 and a high internal impedance of the source 56 coupled to the collector thereof result in an extremely high voltage gain of the output amplifier means, wherein the negative feedback thereof derives from the source of the transistor 59 operating in the common source mode. The gate-source resistance thereof is very high. Any nonlinearities can be virtually eliminated by employing the PA as an output stage of an OA and establishing a negative feedback thereof.

A thermal compensation can be easy accomplished as it applies to low power devices only, such as the components 51 thru 53, the transistor 55 and diode 58. No thermal compensation and no matching of the MOSFETS is necessary. The second half of the PA comprises analogous components. In particular, the conductivity types of the respective transistors are opposite.

Figure 6:
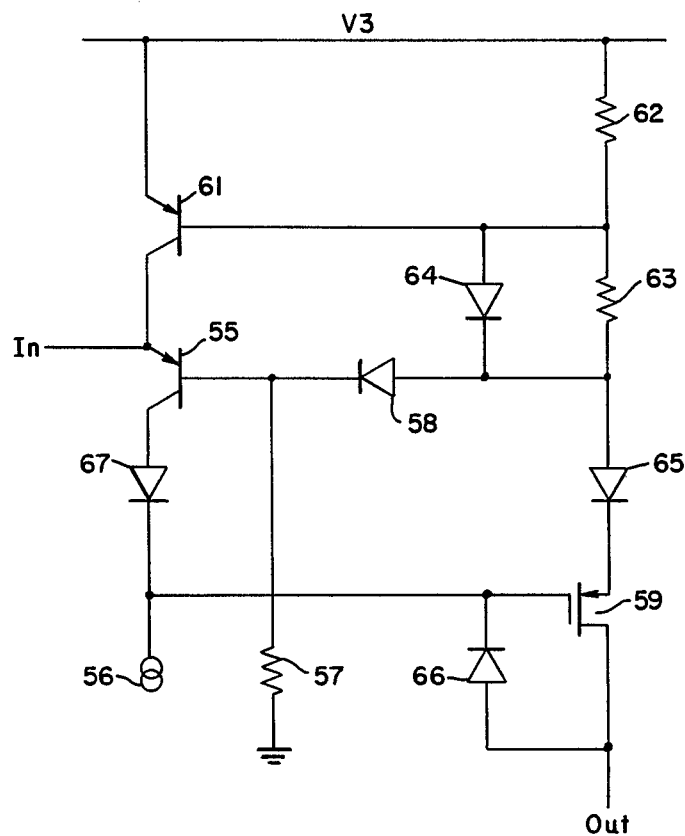
FIG. 6 is a part of the FIG. 5 embodiment, further including a short circuit protection and implementing an operation with a multilevel power supply.

FIG. 6 is a part of the FIG. 5 embodiment, further including a short circuit protection and implementing an operation with a multilevel power supply. Specifically, the components 55 thru 59 are common to FIGS. 2 and 3, wherein the same reference numbers have been assigned for clarity. Therefore, is in the input of the respective output amplifier means.

The stability of the quiescent current due to temperature changes, PA output signal etc., is improved. The resistor 63 corresponds to 60 to FIG. 5 and can have a higher value as the diode 64 is coupled in parallel for limiting a voltage drop thereacross. The quiescent current flowing thru the resistor 63 may result in a substantially higher voltage drop thereacross, wherein the diode 64 is then cut off. However, the diode 64 or the resistor 63 and diode 64 are optional.

The short circuit protection is accomplished by sensing an excessive drain current of the transistor 59 and limiting the input signal of the output amplifier means. A resistor coupled anywhere in the drain-source path of the transistor 59 can be used. The resistor 62 of a small value, coupled to the source of the transistor 59 via the resistor 63 and diode 65 is shown. A too high PA output current provided by the transistor 59 results in a collector current of the pnp transistor 61 which then limits the emitter voltage of the transistor 55. The emitter and collector of the transistor 61 are coupled to the source V3 and emitter of the transistor 55 respectively. The base of the transistor 61 is coupled directly to the resistor 62. However, a resistor network can be employed for determining an operation within the SOA of the transistor 59. Specifically, the transistor 61 and resistor 62 correspond to respectively 30 and 31 of FIG. 3. The pair of the resistors 32 and 33 shown therein can be implemented analogously.

An operation with a multilevel power supply is made possible by the diodes 65 thru 67. The diodes 65 and 67 are connected in series with the source and collector of the transistors 59 and 55 respectively for preventing reverse polarity currents therein and in related components. The diode 66 coupled between the gate and drain of the transistor 59 is employed for a further protection thereof. The diode 65 can be coupled anywhere in the drain-source path of the transistor 59 to conduct the drain current thereof. For instance, it can be connected in series with the drain thereof, whereby the diodes 66 and 67 are superfluous. However, the drain is then no longer directly connected to the output of the PA. Obviously, this reverse current protection and the hereinabove described short circuit protection can be analogously applied to the other half of the FIG. 5 PA.

The above embodiments referred to PAs employing output transistors of opposite conductivity types. For instance, FIG. 4 shows the p-channel MOSFET 47 and n-channel MOSFET 48. Obviously, a PA employing output transistors of an even conductivity type can be constituted. For instance, the inputs of the OA 45 in FIG. 4 can be exchanged, the source and drain of the transistor 47 swapped and the conductivity type thereof changed to n-channel. Now, this half of the PA employs the output transistor having the source coupled to the output of the PA and the part of the present specification referring to such a configuration applies. For instance, a short circuit and reverse current protections can be implemented in this half in compliance with FIG. 3 which discloses the output transistor 28 having the emitter (or source) coupled to the output of the PA.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Power amplifier, comprising:
   an input amplifier means for amplifying an input signal of the power amplifier and having a pair of outputs;
   a pair of nodes;
   a power supply means having a pair of outputs for providing supply signals;
   a pair of resistive means separately coupled between the nodes and power supply outputs for conducting the supply signals;
   a pair of output amplifier means each having first and second inputs for amplifying a signal appearing thereacross, and an output, wherein the first inputs are separately coupled to the input amplifier means outputs and the second inputs are separately coupled to the nodes; and
   a pair of transistors each having a base, first and second electrodes, wherein the bases are separately coupled to the output amplifier means outputs, the first electrodes are separately coupled to the nodes, and the second electrodes are coupled together for providing an output signal of the power amplifier.

2. Power amplifier of claim 1 wherein the input amplifier means includes a pair of second resistive means separately coupled to the input amplifier means outputs for obtaining voltage drops in response to the input signal of the power amplifier.

3. Power amplifier of claim 1 wherein the input amplifier means includes at least one current source means coupled to one of the input amplifier means outputs for determining a quiescent current of the transistor coupled thereto via the respective output amplifier means.

4. Power amplifier of claim 1 wherein the input amplifier means includes a pair of inputs and a pair of second transistors each having a base coupled to one input, an emitter coupled to the other input, and a collector, and
   further wherein the collectors are separately coupled to the input amplifier means outputs.

5. Power amplifier of claim 1 wherein the first and second electrodes of at least one transistor are a collector and emitter respectively, and
   further wherein the first and second inputs of the output amplifier means which is coupled to the one transistor are inverting and noninverting respectively.

6. Power amplifier of claim 5 wherein the respective output amplifier means includes a second transistor having a base, emitter and collector coupled respectively to the first input, second input and output of the output amplifier means.

7. Power amplifier of claim 1 wherein the first and second electrodes of at least one transistor are an emitter and collector respectively, and further wherein the first and second inputs of the output amplifier means which is coupled to the one transistor are noninverting and inverting respectively.

8. Power amplifier of claim 7 wherein the respective output amplifier means includes a second transistor having an emitter, base and collector coupled respectively to the first input, second input and output of the output amplifier means.

9. Power amplifier of claim 1 wherein at least one resistive means includes a diode means for limiting a voltage thereacross.

10. Power amplifier of claim 1 further including at least one means for sensing an excessive current in one of the electrodes of one of the transistors and accordingly limiting a signal applied to the first input of the output amplifier means coupled to the one transistor.

11. Power amplifier of claim 10 wherein the means for sensing and limiting includes a second amplifier means for sensing an excessive voltage across the resistive means coupled to the one transistor and accordingly providing a signal to the respective first input.

12. Power amplifier of claim 10 wherein the means for sensing and limiting includes:

a second resistive means coupled in series with the respective electrode for conducting a current therein; and a second amplifier means for sensing an excessive voltage across the second resistive means and accordingly providing a signal to the respective first input.

13. Power amplifier of claim 10 wherein the means for sensing and limiting includes a means for sensing a voltage at the second electrode of the one transistor and accordingly determining the excessive current.

14. Power amplifier of claim 1 further including at least one diode means coupled in series with one of the electrodes of one of the transistors for preventing reverse polarity currents therein.

* * * * *